US005765982A

United States Patent [19]

Martin et al.

[11] Patent Number: 5,765,982
[45] Date of Patent: Jun. 16, 1998

[54] AUTOMATIC WAFER BOAT LOADING SYSTEM AND METHOD

[75] Inventors: John M. Martin, Apache Junction; Arthur W. Harrison, Mesa, both of Ariz.

[73] Assignee: Amtech Systems, Inc., Tempe, Ariz.

[21] Appl. No.: 500,375

[22] Filed: Jul. 10, 1995

[51] Int. Cl.⁶ .................................................. B65G 25/04
[52] U.S. Cl. ........................... 414/156; 414/198; 414/938; 414/940
[58] Field of Search ..................... 414/749, 404, 414/940, 938, 156, 172, 173, 198

[56] References Cited

U.S. PATENT DOCUMENTS

| | | | |
|---|---|---|---|
| 4,543,059 | 9/1985 | Whang et al. | 432/11 |
| 4,568,234 | 2/1986 | Lee et al. | 414/938 X |
| 4,744,712 | 5/1988 | Mitchell | 414/217 |
| 4,767,251 | 8/1988 | Whang | 414/940 X |
| 5,374,153 | 12/1994 | Nishi | 414/222 |

FOREIGN PATENT DOCUMENTS

| | | | |
|---|---|---|---|
| 1-164027 | 6/1989 | Japan | 414/940 |
| 5-326475 | 12/1993 | Japan | 414/938 |

OTHER PUBLICATIONS

Photo of prior wafer loading system marketed by Thermco (date not known).

*Primary Examiner*—Donald W. Underwood
*Attorney, Agent, or Firm*—Cahill, Sutton & Thomas P.L.C.

[57] ABSTRACT

A system for automatic loading of wafer boats onto a cantilever paddle for insertion of the wafer boats into a furnace tube includes an end effector carriage moving on a track and supporting an end effector having spaced, parallel pads to engage opposed outer side portions of a wafer boat. The end effector receives a wafer boat from a robotic arm of an elevator. The robotic arm moves transversely relative to the track to position the wafer boat over the track on which the paddle carriage moves. The end effector carriage moves the end effector pads under the wafer boat, lifts it from a pair of elevator tines, moves the wafer boat over a desired part of the paddle, and lowers the wafer boat onto the paddle. The end effector carriage then returns the end effector to an initial location. The elevator and end effector main the wafer boat at a slight tilt as it is shifted from a wafer boat queue to the cantilever paddle so as to prevent rattling of wafers held in slots of the wafer boat due to vibration of the system.

13 Claims, 10 Drawing Sheets

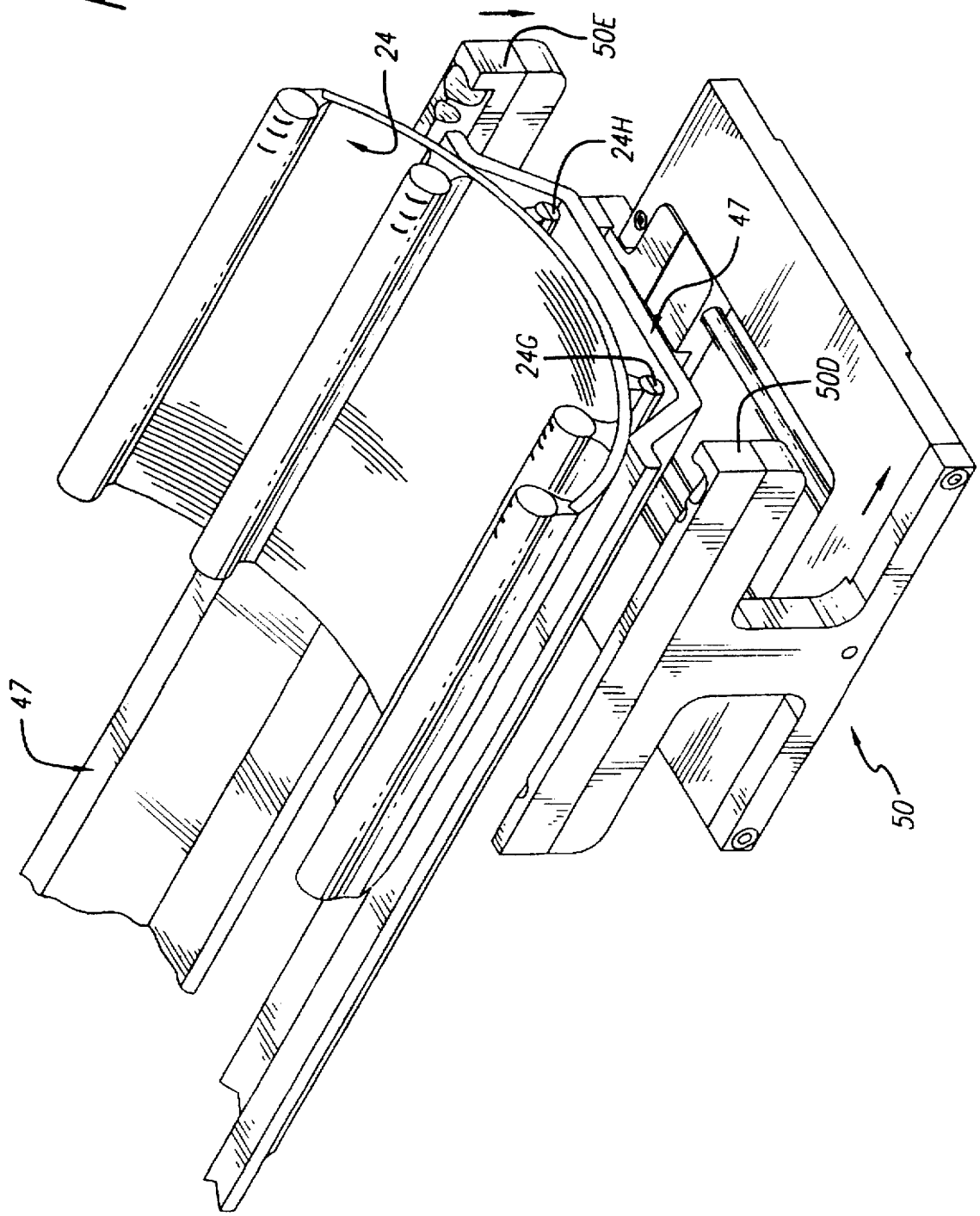

AUTOMATIC WAFER BOAT LOADING SYSTEM AND METHOD

BACKGROUND OF THE INVENTION

The invention relates to a system for automatically loading semiconductor wafers into a diffusion furnace, and particularly to such a system which uses non-articulated, rather than articulated, robotic members, is not overly complex in structure, and is relatively inexpensive compared to commercially available automatic loading systems for loading wafer boats onto cantilever paddles.

The present assignee has marketed a simplified automatic wafer loading system for loading slotted cantilever tubes of the type described in U.S. Pat. No. 4,543,059, using the trademark ATMOSCAN. That automatic wafer loading system is much simpler in construction and lower in cost than automatic wafer loading systems ordinarily used for loading wafer boats into diffusion furnaces. One known system for loading a number of loaded wafer boats onto a silicon carbide cantilever "paddle" is marketed by PRI, Inc. (Precision Robotics, Incorporated). This system includes articulated "hand", "arm", and "shoulder" elements to load wafer boats onto a silicon carbide paddle. The PRI system also has the capability of storing information regarding locations of wafer boats, locations of test wafers in each wafer boat, and separately identifying and loading test wafers. The PRI system is marketed for $400,000-$500,000. Another complex prior art wafer loading system is marketed by Tokyo Electron Limited, and sells for $600,000-$700,000. Most of the available systems for loading wafer boats onto cantilever paddles use the articulated arm members to carry a wafer boat transversely and directly to the desired location on the cantilever paddle.

The above-mentioned non-articulated ATMOSCAN cantilever tube loading system mentioned above includes a queue assembly that moves on a base. The base also supports a track on which a carriage supporting the cantilever tube moves. "Shell" type wafer boats, which typically carry 25-50 wafers, are manually loaded onto a queue rack. A "queue carriage" lifts the next available wafer boat off of the queue rack and carries it to a vertical elevator having a pair of "fork lift" tines which engage the bottom of the wafer boat and lift it off of the "queue nest". The elevator is operated under computer control. The computer is programmed to raise the wafer boat to the level of one of four desired wafer loading assemblies. A telescoping arm supports the tines, and moves transversely to the longitudinal axis of the ATMOSCAN cantilever tube, carrying the wafer boat into precise alignment with such longitudinal axis. An IBAL (Individual Boat Automated Loading) assembly is mounted on a carriage that moves along the same track as the carriage that supports the cantilever tube. The IBAL assembly includes a centered lift or "nest" mechanism aligned with a loading slot in the bottom surface of the cantilever tube. That lift mechanism is narrower than the slot, and lifts the wafer boat off the tines and carries it into the open end of the slotted cantilever tube; the lift or "nest" mechanism extends through the loading slot to accomplish this.

Still under programmed control, the IBAL assembly carries the loaded wafer boat into the next available wafer boat position inside the cantilever tube. The IBAL assembly then lowers the wafer boat onto the bottom inside surface of the cantilever tube so it covers part of the tube of the loading slot. The IBAL assembly then moves back to its initial position and waits for another loaded wafer boat to be delivered by an elevator assembly.

The foregoing prior art system is subsequently described in more detail with reference to FIG. 1, which also illustrates the present invention for loading a cantilever paddle.

By way of background, there are many existing wafer fabrication facilities in wafer fabrication facilities throughout the world. Most such wafer fabrication facilities have been designed with a fixed amount of floor space for each diffusion furnace and its associated wafer loading station. Such fixed amounts of floor space often are not large enough to accommodate the large, complex, expensive automatic cantilever paddle wafer loading systems of the type marketed by PRI and Tokyo Electron Limited. In recent years, there has been a substantial increase in the number of new semiconductor wafer fabrication facilities being constructed. The new wafer fabrication facilities allocate larger amounts of floor space for each furnace station (thereby increasing the overhead cost for each furnace) in order to accommodate the larger automatic wafer loading systems of the type marketed by PRI, Tokyo Electron Limited, and others. The new wafer fabrication facilities constitute the main market for such wafer loading systems.

However, there is an unmet need for an inexpensive, effective automatic system for loading wafer boats onto cantilever paddles which can fit into the limited amount of space available for loading stations in the already existing wafer fabrication facilities. There are substantial reasons favoring use of automatic wafer boat loading systems for each furnace station in any wafer fabrication facility, including avoiding safety problems that are associated with operators manually lifting heavy boatloads of semiconductor wafers high enough to place them on the cantilever paddle for the top furnace tube of each furnace station, and reducing the number of yield-reducing human-produced particulates that inevitably are generated by every human-performed task in semiconductor wafer processing. Up to now, however, no one has been able to provide a system that meets the needs of this market at an acceptable cost.

SUMMARY OF THE INVENTION

Accordingly, it is an object of the invention to provide an automatic wafer loading station for loading wafer boats onto a cantilever paddle, which automatic wafer loading station does not use articulated arm mechanisms.

It is another object of the invention to provide an automatic wafer boat loading system which shuttles loaded wafer boats from a queue station onto a cantilever paddle wherein such wafer boats nearly abut each other and are in precise alignment with each other when in their desired position on the paddle.

It is another object of the invention to provide an automatic wafer boat loading station for loading wafer boats onto a cantilever paddle, which automatic wafer boat loading system is much less complex and costly than prior articulated systems for loading wafer boats on cantilever paddles or prior systems which carry wafer boats transversely and directly to their desired locations on the paddles.

It is another object of the invention to provide an automatic wafer boat loading station which not only is much less complex and costly than prior wafer boat loading stations, but also provides substantially improved operator safety compared to wafer boat loading stations wherein wafer boats must be delivered by hand to the level of each cantilever paddle of the loading station, especially the highest cantilever paddle.

It is another object of the invention to provide an automatic wafer boat loading station that not only is much less complex and costly than prior wafer boat loading stations, but also eliminates generation of particulates due to operator handling of wafer boats in the course of manually placing them at the levels of the various cantilever paddles, especially the higher levels of the automatic loading station.

Briefly described, and in accordance with one embodiment thereof, the invention provides a system for automatically loading a wafer boat onto a cantilever paddle for insertion into a furnace to process semiconductor wafers carried by the wafer boat, and for unloading the wafer boat from the paddle after withdrawal thereof from the furnace. The loading station includes a stationary track having a first end and a second end, in alignment with a corresponding furnace tube. The track supports a first carriage that supports a cantilever paddle. The first carriage is moveable from the first end of the track to the second end thereof as the paddle is inserted into the furnace. In one described embodiment, the track supports a second carriage to which an end effector is attached. The end effector includes an upright first support member supporting an elongated first wafer boat support pad. The end effector also includes an upright second support member supporting an elongated second wafer boat support pad that is parallel to the first one. The first and second upright support members are spaced far enough apart that the end effector can be moved along the track with one of the first and second support members on either side of the cantilever paddle, with no physical contact thereto. For one embodiment of the end effector, the second carriage lowers the end effector so that a wafer boat carried on the first and second wafer boat supporting pads is lowered onto a predetermined portion of the cantilever paddle. The second carriage then returns the end effector to an initial location. When the second carriage is moved to a "home" position, one of the support members moves toward the other to allow a quartz "door" supported by the first carriage to bypass the end effector as the cantilever paddle is advanced by the first carriage to position one or more wafer boats in a hot zone of the furnace tube. In another embodiment, an end effector of the present invention includes a pair of scissors-connected members which act as the first and second support members and as elevators for the first and second wafer boat support pads. A pneumatic cylinder controls elevation of the first and second wafer boat support pads, whereby vertical movement of the first and second wafer boat support pads thereof is accomplished in the end effector, rather than in the second carriage.

A non-articulated arm includes a supported end and also a free end that is moveable transversely with respect to the axis of the cantilever paddle. The non-articulated arm is supported by an elevator which moves the non-articulated arm from the level of a queue mechanism to a level at which a wafer boat lift supporting the wafer boat can place the wafer boat on the wafer boat supporting pads of the end effector. The first and second carriages, the elevator, and the queue mechanism all operate in response to and according to an associated programmed control device.

In operation, a plurality of wafer boats are placed on a queue rack, each wafer boat being loaded with semiconductor wafers to be inserted into a furnace tube. The queue rack includes two rails on which the wafer boats initially rest. A queue mechanism includes a lift element that extends upward between the rails of the queue rack, lifting the next available wafer boat, carrying it to the elevator, and positioning the wafer boat above two slightly tilted tines of the wafer boat lift. The wafer boat lift is attached to an elevator which, under programmed control, lifts the wafer boat to the level of the desired furnace tube. The tilt causes the semiconductor wafers in the wafer boat to lean against sides of the slots thereof, preventing the wafers from rattling because of system vibration. The elevator includes the non-articulated arm which carries the wafer boat transversely toward the end effector. Under programmed control, the end effector raises the first and second wafer boat support pads to lift the wafer boat from the tines of the wafer lift. The wafer boat support pads maintain the tilt of the wafer boat. The second carriage moves along the track toward the free end of the cantilever paddle, the first and second support members of the end effector clearing either side of the paddle and supporting the wafer boat above the paddle. The end effector or second carriage lowers the wafer boat onto the desired part of the cantilever paddle and then returns to the initial position, prior to receiving another loaded wafer boat. After the fully loaded paddle has been inserted into the furnace, the wafers have been processed, and withdrawn from the furnace, a reverse operation is used to return the wafer boats and processed wafers therein back to the queue rack.

BRIEF DESCRIPTION OF THE DRAWINGS

FIG. 3A is a perspective view of an end effector of the present invention, illustrated lowering a wafer boat onto a cantilever paddle.

DETAILED DESCRIPTION OF THE PREFERRED EMBODIMENT

Figure 1:
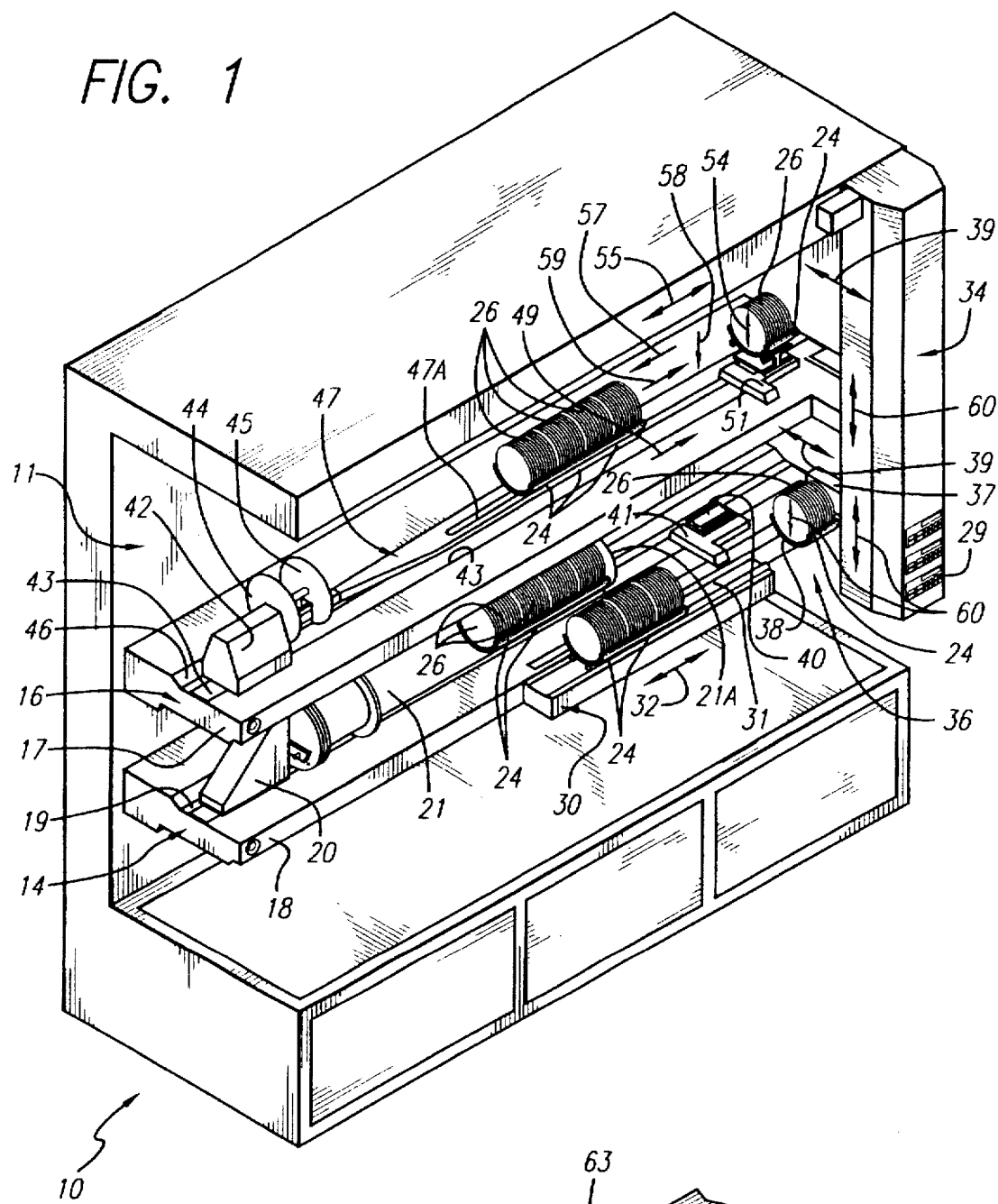
FIG. 1 is a perspective view of an automatic wafer loading station for a diffusion furnace, showing two of four automatic wafer boat loading assemblies, one being prior art and another being an embodiment of the present invention.

Referring to FIG. 1, automatic wafer boat loading station 10 is positioned end-to-end with a diffusion furnace cabinet (not shown) which contains a "stack" of three or four horizontal, parallel, furnace tubes. A conventional scavenger (not shown) is located between wafer boat loading station 10 and the furnace cabinet, which is located on the right end of loading station 10.

In FIG. 1, the previously mentioned prior art furnace loading assembly 16 includes a horizontal base 18. A longitudinal track 19 of base 18 is aligned with a furnace tube at the same level. A carriage 20 moves on track 19. Carriage 20 supports a cantilever tube 21, which has a loading slot (not shown) in its end bottom surface to allow loading of a plurality of "shell" wafer boats 24 through an open distal end of cantilever tube 21. (Hereinafter, all wafer boats are designated by numeral 24; it will be apparent from the description which wafer boat is being referred to.) A computer or programmed control device represented by numeral 29 and operated by means of a control panel causes carriage 20 to carry cantilever tube 21 and the wafer boats therein into the hot zone of the furnace tube, where processing operations are performed on the semiconductor wafers 26. The details of carriage 20 and cantilever tube 21 and methods of use are set forth in commonly assigned U.S. Pat. No. 4,543,059.

For the past two years, the present assignee has marketed an automatic wafer loading assembly for loading wafer boats into (and unloading wafer boats from) the above-described cantilever tube 21, which the assignee markets under the trademark "ATMOSCAN". Such automatic wafer loading assembly includes a queue rack with a pair of spaced rails 31. A plurality of wafer boats loaded with wafers ready for processing in the various furnace tubes are placed at predetermined locations of queue rack 31.

Figure 2B:
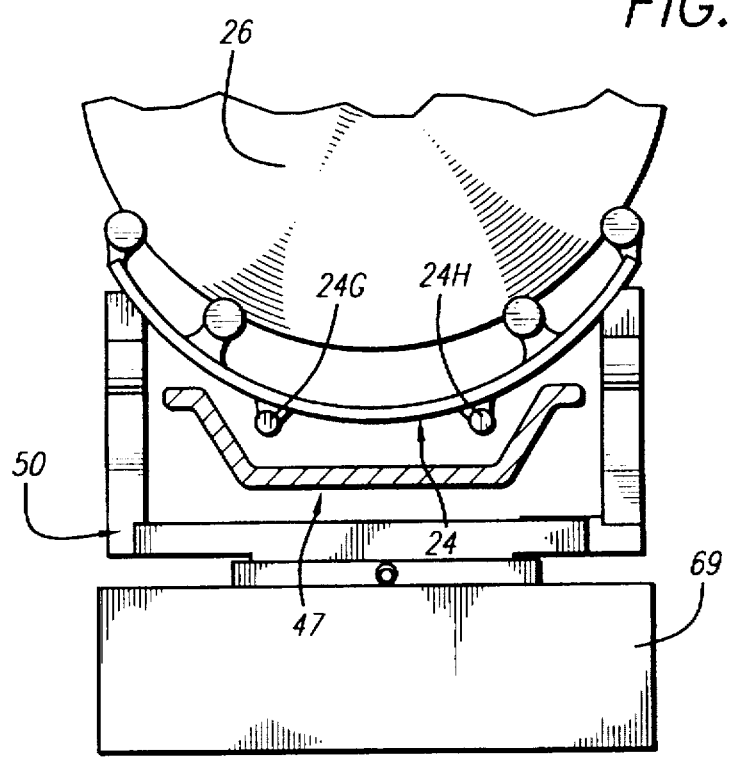
FIG. 2B is a modified end view of FIG. 2A.
Figure 2A:
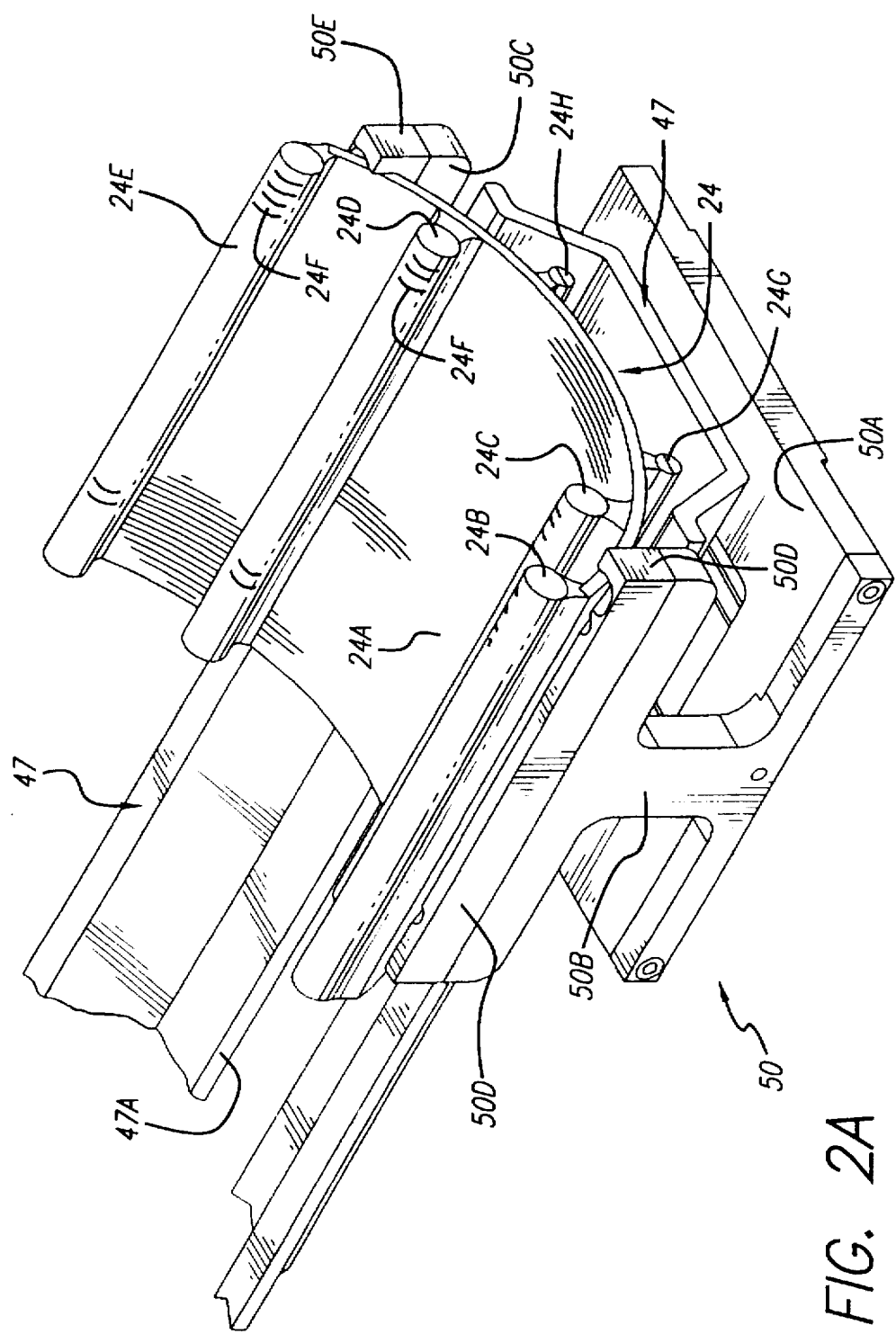
FIG. 2A is a perspective view of an end effector of the present invention loading a quartz shell boat onto a cantilever paddle, illustrating the end effector in a raised position.

It may be helpful at this point to refer to FIG. 2A for a brief description of the quartz wafer boats 24, called "shell" boats because each wafer boat includes a semicylindrical shell portion 24A. Four parallel spaced rails 24B, C, D, and E are attached to the upper surface of shell 24A as shown. Each such rail has spaced notches 24F aligned with corresponding notches in the other rails, to support a plurality of parallel wafers 26. A pair of spaced legs are formed by rails 24G and 24H, which are similarly attached to the bottom surface of semicylindrical shell 24A.

Queue mechanism 30 operates under programmed control, in response to pressing of a control button on the control panel of the programmed control device 29, to raise a queue "nest" 63 (FIG. 1A) between the legs 24G and 24H of wafer boat 24 to meet the bottom surface of shell 24A and lift the wafer boat 24 and wafers 26 therein slightly above queue rack 31. (The upper surface of queue nest 63 is semicylindrical, with the same radius of curvature as the bottom surface of shell 24A.) The tolerance between the inside edges of legs 24G and 24H and the side edges of queue nest 63 is approximately ±0.25 inches to thereby maintain precise alignment of wafer boat 24 as it is shuttled from queue rack 31 to a desired location inside cantilever tube 21 (or for the present invention, onto cantilever paddle 47).

Figure 1A:
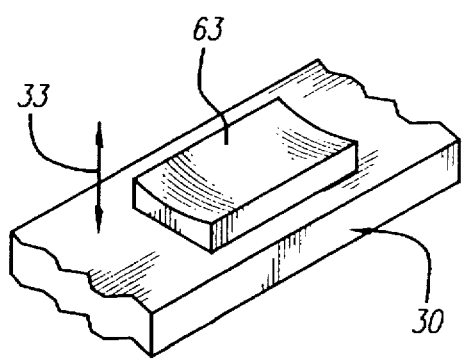
FIG. 1A is a partial perspective view of the queue 30 of FIG. 1.

After queue nest 63 (which is vertically moveable relative to the base of queue mechanism 30 under programmed control in the directions indicated by arrows 33 in FIG. 1A) has lifted the next available wafer boat 24 from queue rack 31, queue mechanism 30 moves to the right in the direction of arrows 32 to position wafer boat 24 over a pair of tines 38 supported by an elevator 36.

In the prior art ATMOSCAN cantilever tube wafer boat loading system, elevator 36, which is connected to elevator tower 34 which raises/lowers elevator 36 as indicated by arrows 60 raises tines 38, which are positioned to engage shell 24A a suitable distance below outer notched rails 24B. Elevator 36, under programmed control, raises wafer boat 24 to a level slightly above the level of an IBAL (Individual Boat Automatic Loading) "nest" or lift assembly 40. IBAL lift assembly 40 is part of IBAL carriage 41, which moves on track 19. The free end of robotic arm 37 moves linearly as induacted by arrows 39 toward the longitudinal axis of cantilever tube 21 above track 19 and holds wafer boat 24 immediately above IBAL lift assembly 40. Under programmed control, IBAL lift assembly 40 is raised slightly between the elevator tines 38 to raise wafer boat 24 off elevator tines 38. IBAL carriage 41 then moves wafer boat 24 to the left along track 19, with IBAL lift assembly 40 extending upward through the loading slot in the bottom of slotted cantilever tube 21, to the next available wafer boat position inside cantilever tube 21. Then, still under programmed control, IBAL lift assembly 40 is lowered, placing wafer boat 24 on the inside bottom surface of cantilever tube 21 so it covers a portion of the loading slot thereof. IBAL carriage 41 then moves to the right to its initial position, which may be the same as or adjacent to the wafer boat "hand-off" location, and waits for transfer of the next wafer boat to the hand-off location. This process is repeated until a suitable number of wafer boats have been positioned end-to-end inside cantilever tube 21, sealing the bottom of the cantilever tube 21 over its loading slot.

Now, and in accordance with the present invention, furnace loading assembly 16 in FIG. 1 includes a conventional silicon carbide paddle 47 (having a slot 47A therein) supported by a paddle carriage 42 that travels on another track 43. The assembly includes a quartz "door" 45 which abuts the mouth of a diffusion tube in the furnace cabinet into which paddle 47 and a plurality of wafer boats 47 (and semiconductor wafers 26 therein) supported thereby are inserted. A stainless steel "door" 44 closes off the conventional scavenger when paddle 47 is fully inserted into the furnace tube.

In accordance with one aspect of the present invention, the lift or nest element 63 in FIG. 1A is tilted by approximately 3 to 9 degrees so that all of the wafers 44 lean against the same edges of the slots 24F (FIG. 2A) in wafer boat 24. Tines 38 of the elevator 36 maintain the same 3–9 degree tilt angle of the wafer boat. The wafer boat support pads 50D and 50E also maintain the same 3–9 degree tilt angle of each wafer boat 24 until such wafer boat is lowered by end effector 50 onto the desired part of paddle 47. This technique greatly reduces "rattling" of wafers caused by vibration in the wafer transferring system by which the wafer boats are shuttled from queue rack 31 to paddle 47 and vice versa. Elimination of such rattling of the wafers reduces the generation of particulates, and therefore increases the yield and/or reliability of the semiconductor processing operations carried out on the wafers 26.

In accordance with the present invention, carriage 51 replaces prior art IBAL carriage 41, and is adapted to support an "end effector" 50 which loads wafer boats 24 onto cantilever paddle 47. Carriage 51 includes an ordinary lift mechanism 69 (FIG. 2B), the details of which can be easily implemented by those skilled in the art. Note that slot 47A is not a loading slot and does not extend all the way to the left end of paddle 47, in contrast to the loading slot of cantilever tube 21 of the prior art.

Figure 4:
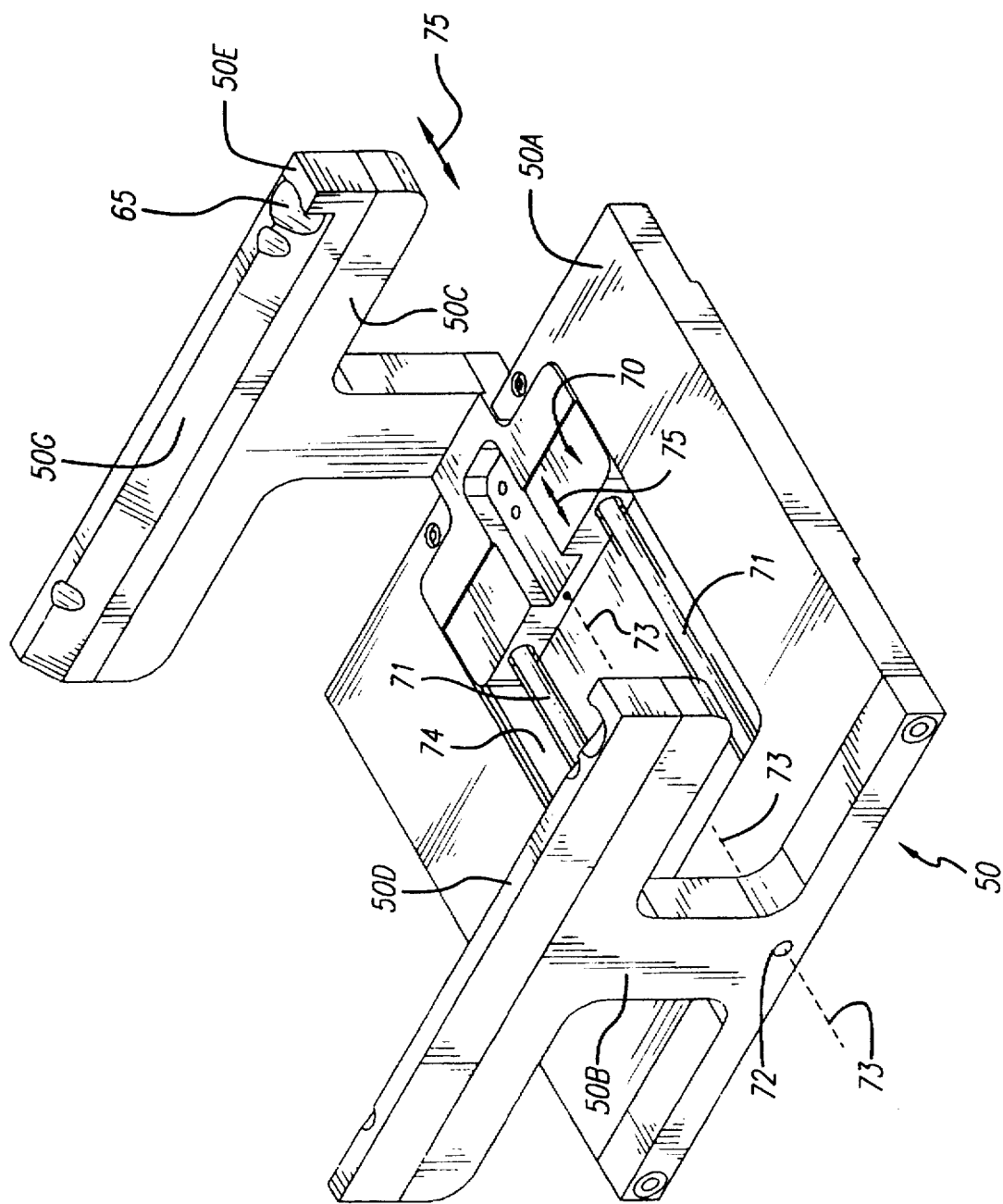
FIG. 4 is a perspective view of one embodiment of the end effector of the present invention.

At this point, it may be helpful to refer to FIG. 4 for a description of end effector 50, which includes a base 50A that is supported by end effector carriage 51. The high temperature wafer boat support pad 50D, which can be composed of special materials, such as silicon carbide or ULTUM carbon-impregnated thermal plastic that are capable of withstanding temperatures in excess of 700° Centigrade, is supported horizontally (relative to track 43) and parallel to the longitudinal axis of paddle 47 by a vertical or upright member 50B attached to one side of base plate 50A.

A second plastic wafer boat support pad 50E parallel to pad 50D is supported on a vertical or upright member 50C. (Pads 50D and 50E are shown as individual elongated pads, but each could be implemented as two or more non-elongated pads.) Vertical a upright member 50C is attached to a carriage 70 that slides in a recess 74 in the upper surface of base plate 50A. A pair of pneumatic cylinders 71 are installed in base plate 50A to be movable in the direction of arrows 75, thereby allowing vertical member 50C and wafer boat support pad 50E to move or "collapse" several inches toward member 50B and support pad 50E as end effector 50 moves into a "home" position at the extreme right end of track 43 and approximately six inches laterally therefrom toward elevator and control assembly 34 in FIG. 1. Wafer boat support pads 50D and 50E have inclined support surfaces, such as 50G in FIG. 4, which conform to the cylindrical outer surface of shell 24A (FIG. 2A). An optical wafer boat sensor 65 detects the presence of a quartz wafer boat 24 positioned on end effector 50 as shown in FIG. 2A so that information can be used by the computer or programmed control device 29 in assembly 34 which controls loading station 10.

Figure 5A:
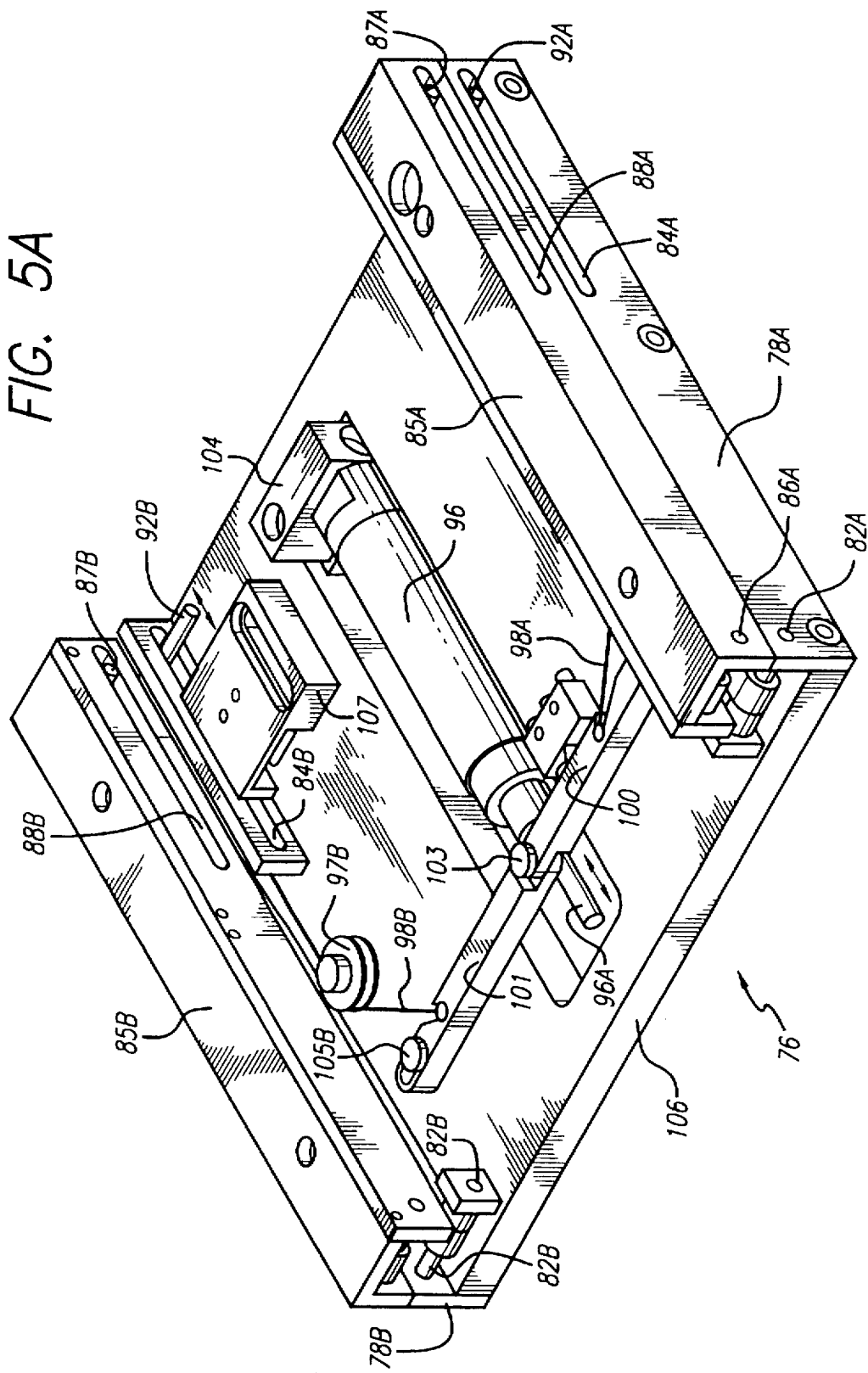
FIG. 5A is a perspective view of an alternate, preferred end effector in its collapsed configuration, which can be used in the system of FIG. 1.
Figure 5B:
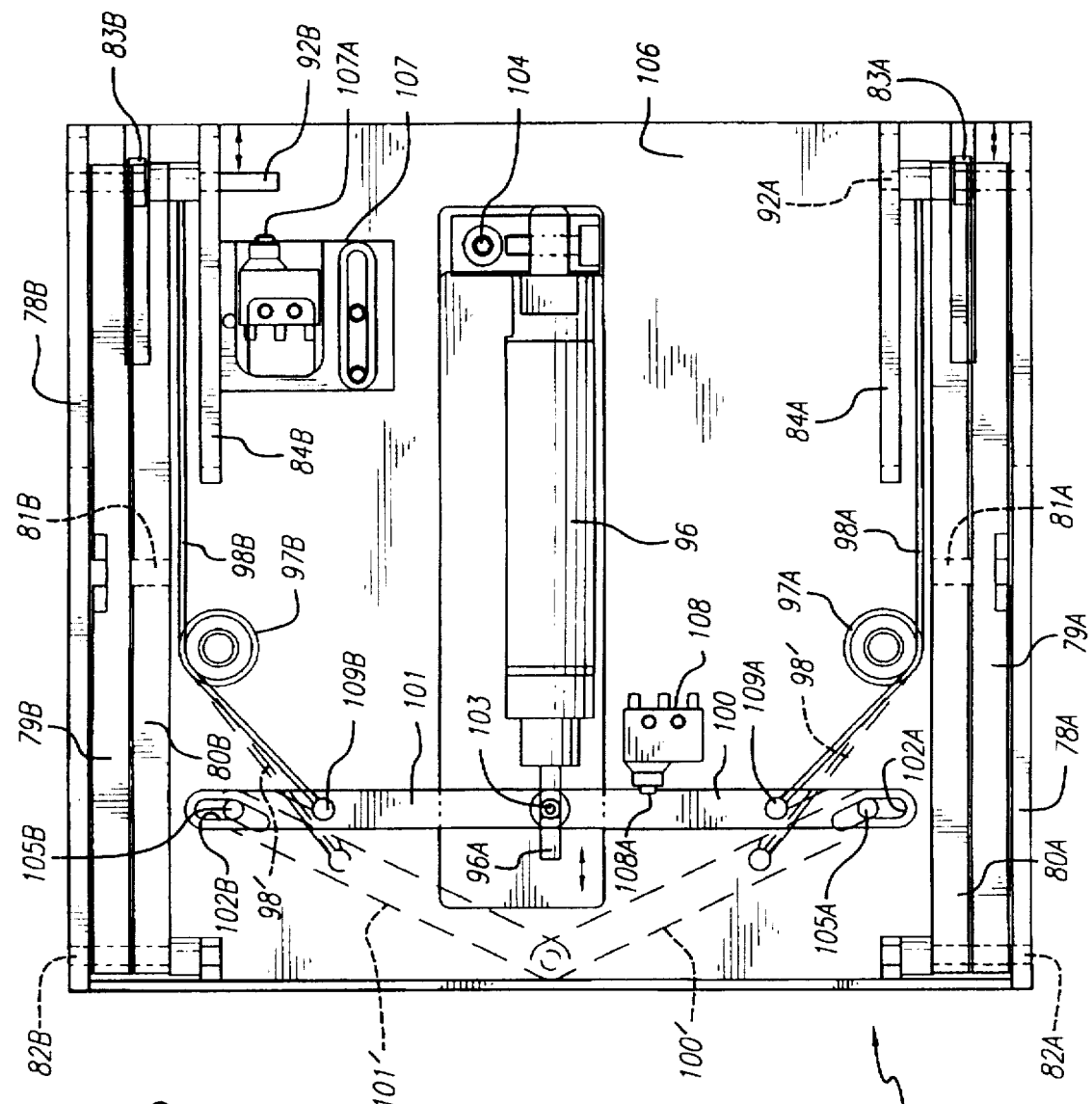
FIG. 5B is a partial plan view of the end effector of FIG. 5A, with the wafer boat support pad rails omitted for clarity of illustration.

Such computer or programmed control device, represented by numeral 29 in FIG. 1, is coupled to control electric motors that operate conventional mechanisms that move cantilever paddle carriage 42, end effector carriage 51, queue mechanism 30, and elevator 36, and also is coupled to control pneumatic cylinders such as cylinder 96 in FIG. 5B and cylinders 71 in FIG. 4 to produce predetermined translation. Programmed control device 29 therefore can be very similar to the programmed control device used in the above mentioned automatic wafer loading assembly previously marketed by the present assignee to load wafer boats into slotted cantilever tubes such as 21 shown in FIG. 1. The modifications of such prior art programmed control device necessary to effectuate loading of cantilever paddle 47 instead of slotted cantilever tube 21 can be easily implemented by one skilled in the art, and therefore the details are not set forth herein. The details of the carriage mechanisms for moving cantilever paddle carriage 42 and end effector carriage 41 and the other moving parts of the system shown in FIG. 1 also in response to the programmed control device also are conventional and easily implemented by one skilled in the art, so the details thereof are not set forth herein.

Pneumatic cylinders 71 can be used to cause the lateral "collapsing" of wafer boat support pad 50E and support member 50C when end effector 50 is in the above-mentioned "home" position. Such "collapsing" is necessary to allow the quartz "door" 45 and the stainless steel "door" 44 to pass by as cantilever paddle 47 and the wafer boats thereon are inserted into a furnace tube. Pneumatic cylinders 71 are controlled by the programmed control system. Alternatively, the above-mentioned "collapsing" of the support pad 50E and support member 50C can be accomplished by use of a cable indicated by dotted lines 73 in FIG. 4 extending through hole 72 to a cam mechanism (not shown) so as to pull carriage 70, vertical member 50C, and wafer boat support pad 50E toward pad 50D as end effector 50 approaches its above-mentioned "home" position.

Next, referring to FIGS. 2A and 2B, queue mechanism 30 and elevator 36 work in essentially the same manner to accomplish loading of paddle 47 as they do to load cantilever tube 24 with wafer boats. However, to load a wafer boat 24 onto paddle 47, elevator 36 raises a boat 24 of wafers 26 to a level slightly above the level at which it subsequently is contacted by the wafer boat support pads 50D and 50E (FIG. 2A).

Figure 1B:
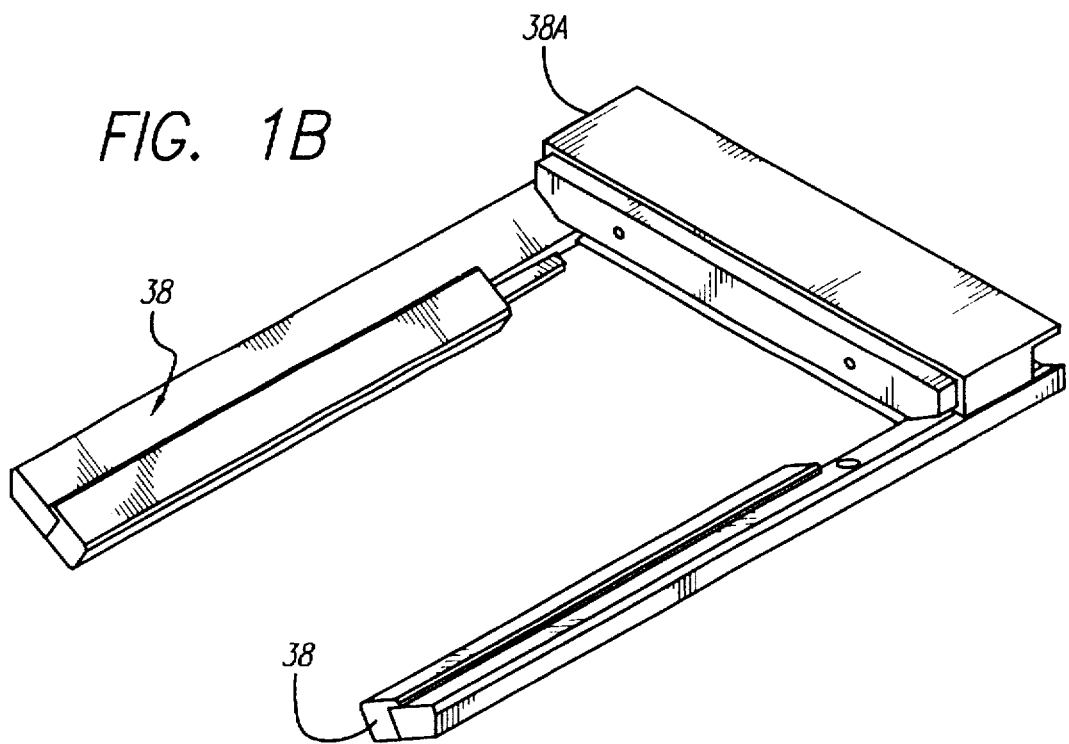
FIG. 1B is a partial perspective view of the assembly of FIG. 1 including wafer boat lift members 38.

Tines 38 of elevator 36, shown in FIG. 1B, receive wafer boat 24 from lift or nest mechanism 63 of queue mechanism 30, shown in more detail in FIG. 1A. The elevator tines 38 are spaced far enough apart to clear the lift 63 of queue mechanism 30, as shown in FIG. 1A. Elevator tines 38 also are close enough together to fit between vertical members 50B and 50C of end effector 50 (in its non-collapsed configuration without touching them).

Wafer boat 24, supported at the above mentioned lift angle by tines 38, then is moved toward furnace loading assembly 16.

Wafer boat 24 then is lifted off tines 38 by raising end effector 50, thereby positioning wafer boat 24 on end effector 50 as indicated in FIG. 2A.

Then, under programmed control, carriage 51 moves left toward the free end of cantilever paddle 47, in the direction of arrow 57 (FIG. 1) until wafer boat 24 is positioned above a desired part of cantilever paddle 47, generally as shown in FIGS. 2A and 2B. At this point, wafer boat 24 remains supported by wafer boat support pads 50D and 50E.

Figure 3B:
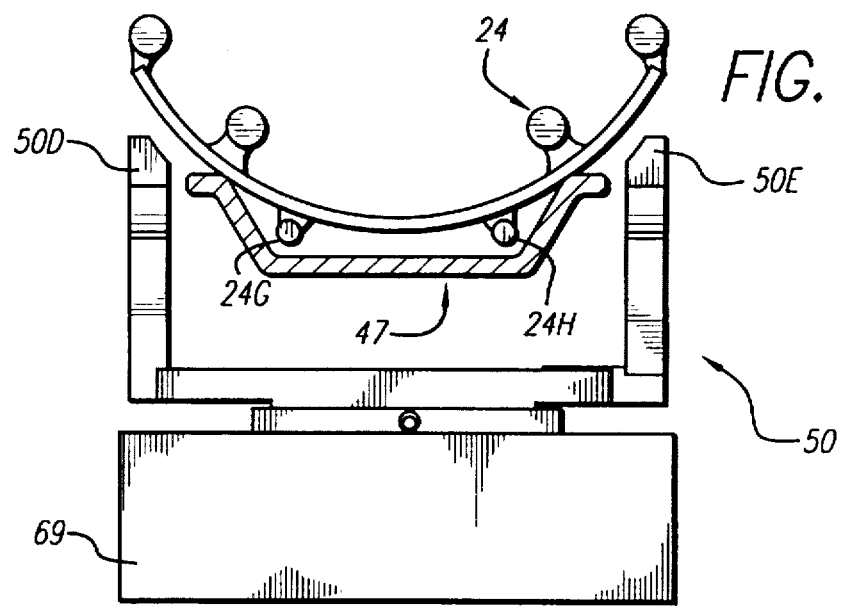
FIG. 3B is a modified end view of FIG. 3A.

Next, under programmed control, end effector 50 lowers wafer boat 24 as indicated by arrow 58 in FIG. 1, placing wafer boat 24 onto the upper edges of the channel of paddle 47, as shown in FIGS. 3A and 3B. At this point, end effector 50 and carriage 51 are returned (under programmed control) to an initial position adjacent to the wafer boat "hand-off" position at which end effector 50 receives wafer boat 24, near the right end of track 43. When paddle 47 is completely loaded with wafer boats 24, carriage 51 and end effector 50 are advanced and moved aside to the above-mentioned "home" position. Air cylinders 71 then are actuated to "collapse" wafer boat support pad 50E and vertical member 50C approximately 2 inches further away from track 43. This allows the loaded cantilever paddle 47 to be inserted by carriage 42 into the adjacent furnace tube and allows quartz door 45 and stainless steel door 44 to bypass wafer boat support pad 50E without touching it.

The process of unloading wafer boats 24 from cantilever paddle 47 after it has been withdrawn from the furnace tube, is essentially the reverse of the above-described wafer boat loading process. That is, in response to an instruction from control panel 29 to the programmed control processor, carriage 51 moves end effector 50, in its lowered position, under cantilever paddle 47 and to the wafer boat 24 to be unloaded. Carriage 51 lifts end effector 50 so that support pads 50D and 50E lift wafer boat 24 above paddle 47 and returns it to the starting position on track 43. Elevator 36 and robotic arm 37 are positioned so that tines 38 accept wafer boat 24 when end effector 50 is lowered, (under programmed control) by carriage 51, imparting the above mentioned 3–9 degree tilt to wafer boat 24. Elevator 36 lifts boat 24 enough to clear wafer boat support pads 50D and 50E (or carriage 51 moves end effector 50 out of the way), returns wafer boat 24 to the assembly indicated by numeral 34, and then lowers wafer boat 24 to the level of queue 30. Wafer boat 24 is transferred to queue mechanism 30, which then moves wafer boat 24 to and lowers it onto queue rack 31. This process is repeated until all wafer boats have been removed from paddle 47 and shuttled to queue rack 31.

FIGS. 5A–D show an alternate, preferred end effector 76 in which the wafer boat lifting mechanism is included in the end effector itself, rather than end effector carriage 51. In end effector 76, a base plate 106, which is attached to carriage 51, supports a first pair of scissors-connected members 79A and 80A connected by a pin 81A (FIG. 5B). A second pair of scissors-connected members 79B and 80B are connected by a pin 81B. Member 79A is pivotally connected to a stationary "fence" member 78A by a bearing and pin 82A, and member 79B is pivotally connected to a stationary fence member 78B by a bearing and pin 82B. End effector 76 includes first and second scissors-connected members each having a first end and a second end. The first end of first scissors-connected member 79A is pivotally connected to base plate 106 by stationary pivot pin and bearing 82A. Similarly, the first end of the second scissors-connected member 80A is pivotally connected to a first pad-supporting member 85A by a pin and bearing 86A which is stationary relative to pads supporting member 85A.

The second end of scissors-connected member 79A is slidably disposed in an elongated slot 88A in the pad-supporting member 85A. The second end of scissors-connected member 80A is slidably disposed in an elongated slot 84A in the base that includes base plate 106 and fence members 78A and 78B rigidly connected thereto. Third and fourth scissors-connected members 79B and 80B each have a first end and a second end. The first end of third scissors-connected member 79B is pivotally connected to base 78A,78B,106 by stationary pivot pin and bearing 82B. The first end of fourth scissors-connected member 80B is pivotally connected to a second pad-supporting member 85B. The second end of scissors-connected member 79B is slidably disposed in an elongated slot 88B of the second pad-supporting member 85B. The second end of the fourth scissors-connected member 80B is slidably disposed in a stationary elongated slot 84B in the fence member 78B of base 78A,78B,106. A first wafer boat support pad 91A (FIG. 5C) is attached to and supported by pad supporting member 85A. A second wafer boat supporting pad 91B (not shown) is attached to and supported by second pad-supporting member 85B. End effector 76 includes a pneumatic cylinder 96 controlled by the programmed control device to raise wafer boat supporting pads 91A,B by moving the second ends of the scissors-connected members 80A and 80B toward the stationary pivots 82A and 82B of scissors-connected members 79A and 79B.

FIG. 5B illustrates how pneumatic cylinder 96 moves arms 100 and 101 to move pivot pins or axles 92A and 92B toward or away from pivot pins or axles 82A and 82B to raise and lower pad support members 85A and 85B. The outer ends of members 100 and 101 have elongated slots 102A and 102B therein, respectively. Stationary pins 105A and 105B extend through elongated slots 102A and 102B, respectively. When piston rod 96A of cylinder 96A moves to the left, the inner ends of arms 100 and 101, which are pivotally connected by pivot pin 103 to piston rod 96A, move to the left, as indicated by dotted lines 100' and 101". The outer ends of arms 100 and 101 move inward as elongated slots 102A and 102B move around stationary pins 105A and 105B, respectively.

Cables 98A and 98B have their left ends anchored at 109A and 109B to intermediate locations of arms 100 and 101, respectively. The right ends of cables 98A and 98B are in effect anchored to axles 92A and 92B, respectively, and pass around idle pulleys 97A and 97B, respectively. Dotted lines 98' indicate the change of position that occurs in the left ends of cables 98A and 98B when pneumatic cylinder 96 moves arms 100 and 101 to the locations indicated by dotted lines 100' and 101'. Although not shown in FIG. 5B because of the complexity of illustrating this point, it is obvious that axles 92A and 92B also move to the left, causing the scissors-connected members to raise pad support members 85A,B and wafer boat support pads 91A,B thereon to the configuration shown in FIGS. 5C and 5D.

Figure 5C:
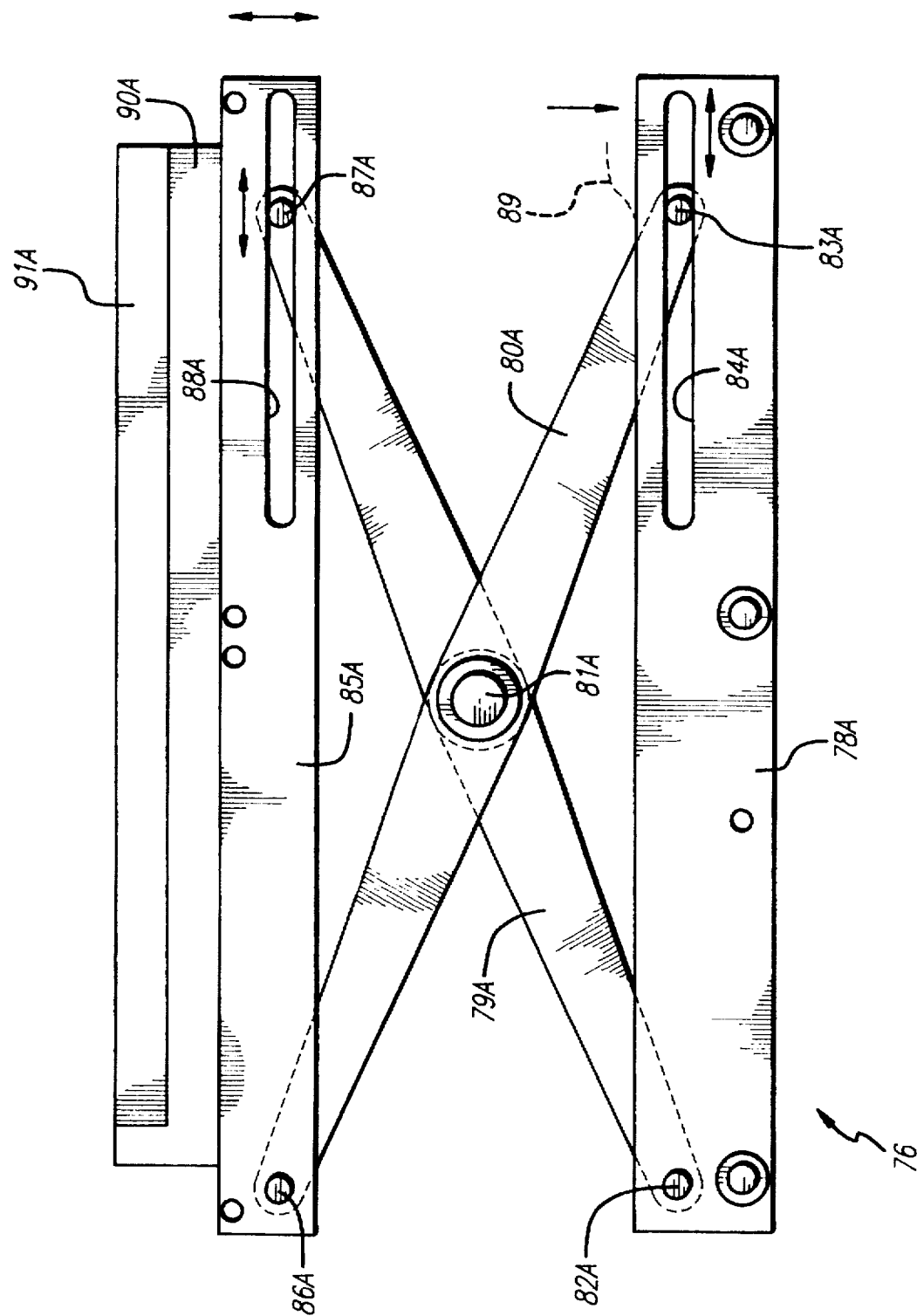
FIG. 5C is a front elevation view of the end effector of FIG. 5A in a raised configuration.
Figure 5D:
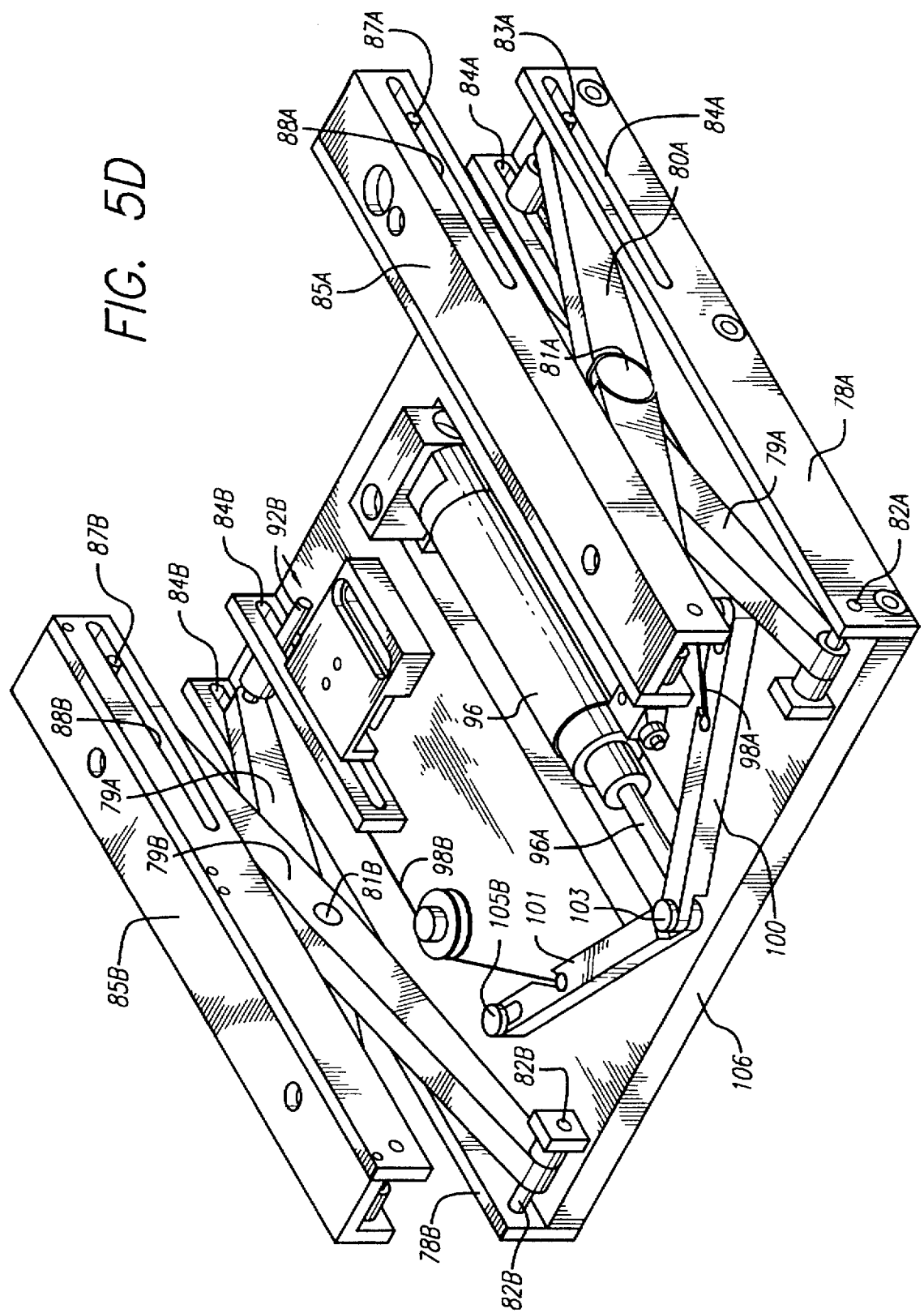
FIG. 5D is a perspective view of the end effector of FIG. 5A in an expanded or raised configuration.

Since maximum lateral force is required to be applied by cables 98A and 98B to produce the initial lifting of pad support members 85A,B, a spring 89, indicated by dotted lines in FIG. 5C, can be provided to absorb the downward force when members 85A,B are lowered to rest on fence member 78A,B, and also provide an initial upward "helping" force on members 85A,B to reduce the initial tensile force required on cables 98A and 98B to initiate lifting of members 85A,B.

In FIG. 5A, end effector 76 is shown in its collapsed configuration. In its fully collapsed configuration, the bottom surfaces of rails 85A,B rest on the upper surfaces of fence members 78A,B. In the lowered position, silicon carbide paddle 47 and the associated door plates 44 and 45 easily pass over the top edges of wafer support pads 90A,B. The wafer boat loading system using end effector 76 therefore can be retrofitted to systems in which the center-to-center spacing between vertically "stacked" furnace tubes is less than is the case if end effector 50 of FIG. 4 is used.

The above described embodiments of the invention provide what has been previously unachievable in the art, a low cost wafer loader for loading boat loads of wafers onto cantilever paddles automatically and precisely, with sufficient precision to provide adequately accurate alignment of wafer boats 24 on paddle 47.

Figure 6:
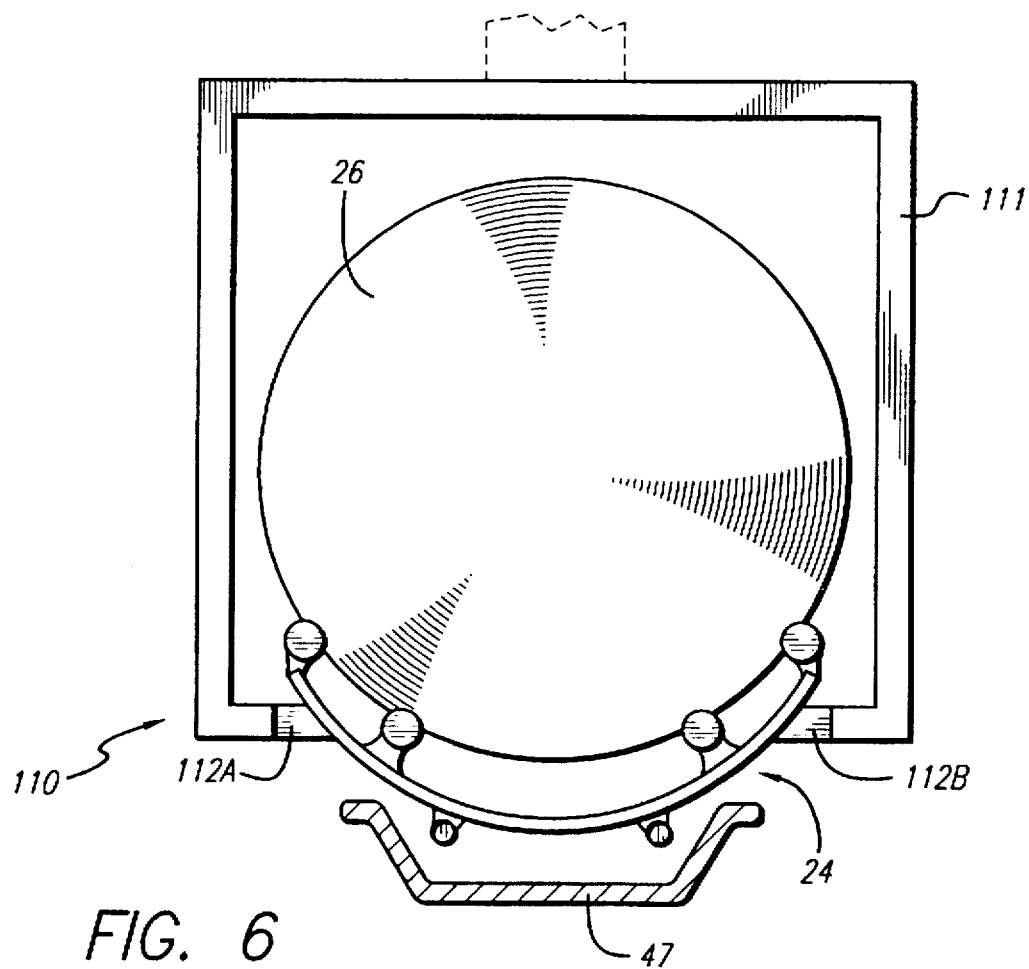
FIG. 6 is an end view diagram useful in explaining an alternate embodiment of the invention.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, in FIG. 6, reference numeral 110 designates a wafer boat holder 111 that supports wafer boat holding pads 112A and 112B which contact the outer surface of wafer boat 24 in the same way that wafer boat support pads 50D and 50E of FIG. 4 do, but are supported from a gantrycrane carriage that moves parallel to track 43, rather than on it. The spacing between pads 112A and 112B needs to be essentially the same as between support pads 50D and 50E of FIG. 4. The generally vertical members of support 111 must be spaced far enough apart to clear the semiconductor wafers 26 and/or the outermost side portions of wafer boat 24; this distance is substantially greater than the width of paddle 47.

What is claimed is:

1. An apparatus for automatically loading a wafer boat onto a cantilever paddle and for unloading the wafer boat from the paddle, the apparatus comprising in combination:

(a) a cantilever paddle;

(b) a stationary track having first and second ends, the track being alignable with a furnace;

(c) a first carriage supported by the track, the paddle having a first end that is cantilever-supported by the carriage, the carriage being movable from the first end of the track to the second end thereof;

(d) a second carriage movable parallel to the track;

(e) an end effector supported by the second carriage, the end effector including a first substantially vertical support member supporting a first wafer boat support pad, and a second substantially vertical support member supporting a second wafer boat support pad, the first and second substantially vertical support members and the first and second wafer boat support pads being spaced apart by a first distance that exceeds a width of the paddle, to thereby allow the end effector to move parallel to the track carrying a wafer boat over the paddle and then lower the wafer boat onto the paddle without any part of the end effector touching the paddle.

2. The apparatus of claim 1 including a robotic non-articulated arm having a free end and a supported end, the free end being movable transversely with respect to the track, and a wafer boat lift carried by the free end of the arm and adapted to engage a bottom surface of the wafer boat to support the wafer boat, the wafer boat lift including at least one horizontal support member, the apparatus further including a programmed control device adapted to cause the free end of the non-articulated arm and the wafer boat lift to move transversely toward a longitudinal axis of the paddle to a location such that the wafer boat is precisely aligned along the axis of the paddle.

3. The apparatus of claim 2 including a vertical movement-producing device associated with the programmed control device and mechanically coupled to one of the end effector and the wafer boat lift to cause relative vertical movement between the at least one horizontal support member and the first and second wafer boat support pads to leave the wafer boat supported on the first and second wafer boat support pads without contact between the horizontal support member and the end effector.

4. The apparatus of claim 3 wherein the second carriage moves the end effector from an initial location to a wafer boat hand-off location and from the wafer boat hand-off location in response to the programmed control device to position the end effector and wafer boat thereon over a first location of the paddle.

5. The apparatus of claim 4 wherein the first vertical movement-producing device causes relative vertical movement between the end effector and the paddle to leave the wafer boat supported on the first location of the paddle, the horizontal movement-producing device being adapted to return the second carriage to the initial location.

6. The apparatus of claim 5 including a queue carriage adapted to transfer a wafer boat to the wafer boat lift, the queue carriage including a queue support member adapted to support the wafer boat without contacting the wafer boat lift as the queue carriage moves to position the wafer boat above the at least one horizontal support member of the wafer boat lift.

7. The apparatus of claim 6 wherein the wafer boat lift includes an elevator associated with the programmed control device and adapted to carry a loaded wafer boat from the queue support member to a first level at which the non-articulated arm can move to position the wafer boat so it is precisely aligned over the end effector in its initial position, and also adapted to carry an unloaded wafer boat from the first level to the queue support member.

8. The apparatus of claim 1 wherein the first vertical support member of the end effector is stationary with respect to the second carriage, and the second vertical support member of the end effector moves toward the first vertical support member when the second carriage is in a home position to allow a quartz door supported by the first carriage to clear the end effector without contact therewith as the paddle is inserted into and withdrawn from the furnace, wherein the end effector includes a base to which the first vertical support member is rigidly attached, and a slide member movable relative to the base plate and rigidly attached to the second vertical support member, and a pneumatic cylinder adapted to force the slide member and the second vertical support member to move toward the first vertical support member when the end effector is in the home position.

9. The apparatus of claim 1 wherein the end effector includes first and second scissors-connected members each having a first end and a second end, the first end of the first scissors-connected member being pivotally connected to a base, the first end of the second scissors-connected member being pivotally connected to the first pad-supporting member, the second end of the first scissors-connected member being slidably disposed in a stationary elongated slot in the first pad-supporting member, the second end of the second scissors-connected member being slidably disposed in a stationary elongated slot in the base, and third and fourth scissors-connected members each having a first end and a second end, the first end of the third scissors-connected member being pivotally connected to the base, the first end of the fourth scissors-connected member being pivotally connected to a second pad-supporting member, the second end of the third scissors-connected member being slidably disposed in a stationary elongated slot of the second pad-supporting member, the second end of the fourth scissors-connected member being slidably disposed in a stationary elongated slot in the base, the first wafer boat support pad being attached to and supported by the first pad supporting member, the second wafer boat supporting pad being attached to and supported by the second pad-supporting member, the end effector including a pneumatic cylinder controlled by the programmed control device to raise the first and second wafer boat supporting pads by moving the second ends of the second and fourth members toward the first ends of the first and third scissors-connected members.

10. The apparatus of claim 7 including a plurality of assemblies each including a stationary track, a first carriage, a second carriage, and an end effector, wherein the programmed control device is adapted to shuttle a plurality of loaded wafer boats from the queue support via the elevator to the respected end effectors.

11. The apparatus of claim 1 wherein the second carriage is supported by the track and moves on the track.

12. The apparatus of claim 1 wherein the first and second wafer boat support pads are elongated, the first wafer boat support pad being generally parallel to the second wafer boat support pad.

13. The apparatus of claim 4 wherein the wafer boat lift and support surfaces of the first and second wafer boat support pads are sloped to maintain the wafer boat in a tilted position to cause the semiconductor wafers to lean against sides of wafer supporting slots in the wafer boat, to thereby avoid rattling of the wafers as the wafer boat is carried by the wafer boat lift and the end effector.

\* \* \* \* \*